United States Patent
Harris

(10) Patent No.: US 8,957,798 B1
(45) Date of Patent: Feb. 17, 2015

(54) ARTIFACT-CORRECTED TIME-INTERLEAVED ADC

(71) Applicant: Fredric J. Harris, Spring Valley, CA (US)

(72) Inventor: Fredric J. Harris, Spring Valley, CA (US)

(*) Notice: Subject to any disclaimer, the term of this patent is extended or adjusted under 35 U.S.C. 154(b) by 59 days.

(21) Appl. No.: 13/937,074

(22) Filed: Jul. 8, 2013

Related U.S. Application Data

(63) Continuation of application No. 13/556,107, filed on Jul. 23, 2012, now Pat. No. 8,482,445.

(60) Provisional application No. 61/510,608, filed on Jul. 22, 2011.

(51) Int. Cl.
*H03M 1/10* (2006.01)
*H03M 1/12* (2006.01)

(52) U.S. Cl.
CPC .............. *H03M 1/10* (2013.01); *H03M 1/1215* (2013.01); *H03M 1/121* (2013.01); *H03M 1/1038* (2013.01); *H03M 1/1225* (2013.01)
USPC ............................ 341/120; 341/118; 341/155

(58) Field of Classification Search
CPC ..... H03M 1/12; H03M 1/1205; H03M 1/121; H03M 1/1215; H03M 1/1225; H03M 1/1038
USPC ......................................................... 341/155
See application file for complete search history.

(56) References Cited

U.S. PATENT DOCUMENTS

| | | | | |
|---|---|---|---|---|
| 7,053,804 B1 * | 5/2006 | Nairn | | 341/118 |
| 7,196,650 B1 * | 3/2007 | Hand et al. | | 341/155 |
| 7,250,885 B1 * | 7/2007 | Nairn | | 341/141 |
| 7,312,734 B2 * | 12/2007 | McNeill et al. | | 341/120 |
| 7,429,939 B2 * | 9/2008 | Xu | | 341/120 |
| 7,898,446 B2 * | 3/2011 | Nagarajan et al. | | 341/118 |
| 7,916,051 B1 * | 3/2011 | Sestok et al. | | 341/120 |
| 8,643,517 B2 * | 2/2014 | Kidambi | | 341/118 |
| 8,860,591 B2 * | 10/2014 | Nozaki | | 341/120 |

* cited by examiner

*Primary Examiner* — Khai M Nguyen
(74) *Attorney, Agent, or Firm* — Law Office of Glenn R. Smith; Glenn R. Smith; Lisa L. Smith

(57) ABSTRACT

An artifact-corrected time-interleaved analog-to-digital converter (ADC) for communications signals offers a significant increase in the available sample rate of ADCs by correcting timing and gain mismatches between ADC channels. These mismatches are corrected in the digital data section of a two-channel TI-ADC for band-pass input signals. This is a realistic communications system scenario as modern system designs lean towards having the ADC interface with the intermediate frequency (IF) signal in the analog section of a digital receiver rather than in the DC centered, analog down converted, in-phase and quadrature pair.

13 Claims, 12 Drawing Sheets

ARTIFACT-CORRECTED TIME-INTERLEAVED ADC

CROSS-REFERENCE TO RELATED APPLICATIONS

This application is a continuation of U.S. patent application Ser. No. 13/556,107, filed Jul. 23, 2012, titled Time-Interleaved Analog-To-Digital Converter, scheduled to issue Jul. 9, 2013 as U.S. Pat. No. 8,482,445; which relates to and claims the benefit of prior U.S. Provisional Application No. 61/510,608 titled Time-Interleaved Analog-To-Digital Converter, filed Jul. 22, 2011. All of the aforementioned prior patents, patent applications and provisional patent applications are hereby incorporated in their entireties by reference herein.

SUMMARY OF THE INVENTION

FIGS. 1A-B illustrate a prior art two-channel time-interleaved ADC (TI-ADC) and an exemplar signal spectrum to be digitized by the TI-ADC, respectively. The minimum sampling rate to avoid aliasing is twice the highest signal frequency, fmax. Hence, accounting for some oversampling as indicated by a clear region (fmax<f<fs/2), the sampling frequency is fs. Time-interleaving of two or more ADCs is the most common way to overcome the limits of the hardware technology that affect an ADC sampling frequency. By using two ADCs, each operating in parallel at a fs/2 sampling rate and a Ts time offset of their 2Ts sample time intervals, the overall sampling frequency of the system is doubled to fs. Ideally, the aliasing terms formed by the individual ADCs, operating at half rate, are cancelled by the interleaving process. This canceling occurs because the aliased spectral component of the time offset ADC has the opposing phase of the same spectral component of the non-time offset ADC. In the absence of time offset errors and gain mismatch the sum of their spectra would cancel their alias components.

FIG. 1C illustrates aliasing in a TI-ADC due to gain and timing phase mismatches of the analog hardware components in the ADCs. The spectral aliasing components from the interleaved time series replicas do not sum to zero. The sample instants of the two ADCs are, in fact, affected by a constant delay, $\Delta t_m$ with m=0, 1, which results in an undesired frequency dependent phase offset of their aliased spectra that prevent their perfect cancellation at the output of the time multiplexer. Mismatches in path gains $g_m$, with m=0, 1, of the TI-ADC, due to tolerance spread of analog components are always present in the ADC's hardware. The gain mismatch contributes a non frequency dependent imperfect cancellation of the spectral components at the output of the TI-ADC system. In order to correct the artifacts caused by the time and gain offsets, these must first be estimated.

Estimation methods can be divided in two categories: (1) foreground techniques, also known as non-blind, that inject a known test or probe signal to estimate the mismatches by measuring the TI-ADC output responses to the probe; and (2) background techniques, also known as blind, for which no information is required about the input signal (except perhaps for some knowledge about the presence or absence of signal activity in certain frequency bands) in order to estimate the mismatches. The first approach has the disadvantage that normal TI-ADC operations are suspended during the probe while in the second approach the calibration process does not interrupt normal operation.

Estimation and correction structures that assume the low-pass nature of the input signal do not work if applied to band-pass communications signals. Advantageously, a semi-blind approach is used to adaptively estimate and correct both time and gain offsets in a two channel TI-ADC operating on such communication signals. Note that the probe signal does not affect the dynamic range of the ADCs because its energy can be low if compared to the received signal energy. However the knowledge of its center frequency allows the probe signal to be easily removed from the baseband down converted signal once it has been recovered.

DETAILED DESCRIPTION OF THE PREFERRED EMBODIMENTS

Figure 1A:
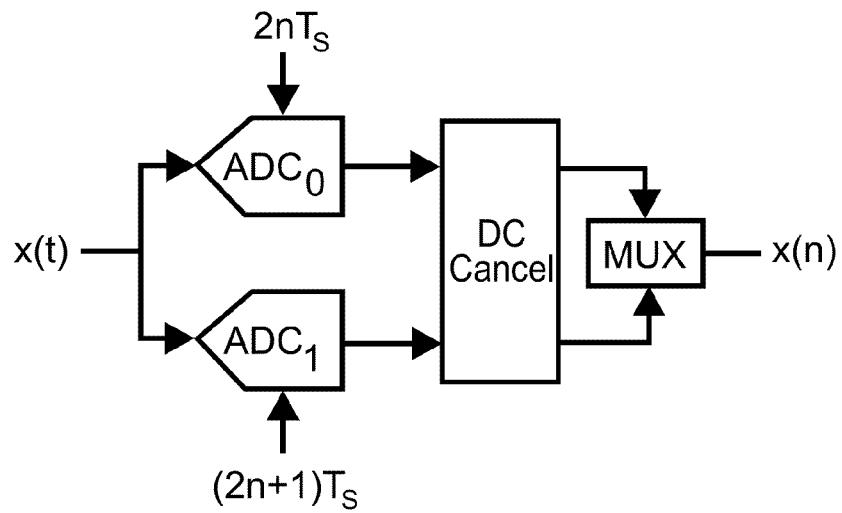
FIG. 1A is a prior art TI-ADC and FIGS. 1B-C are exemplar TI-ADC digitized signal spectrums.
Figure 1B:
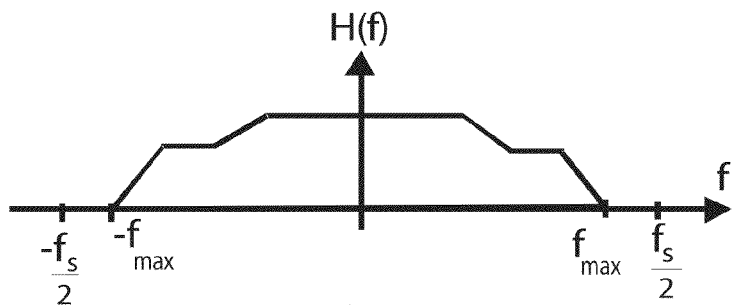
Figure 1C:
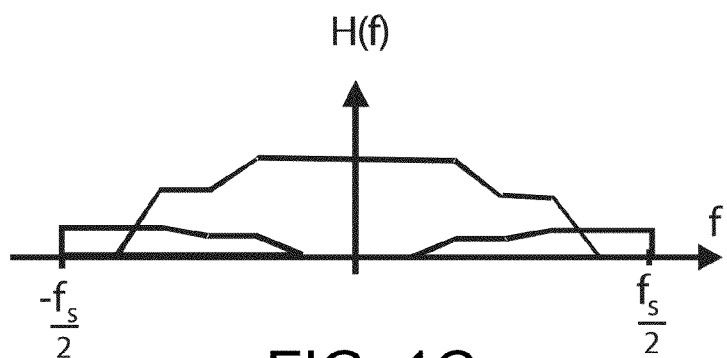
Figure 2:
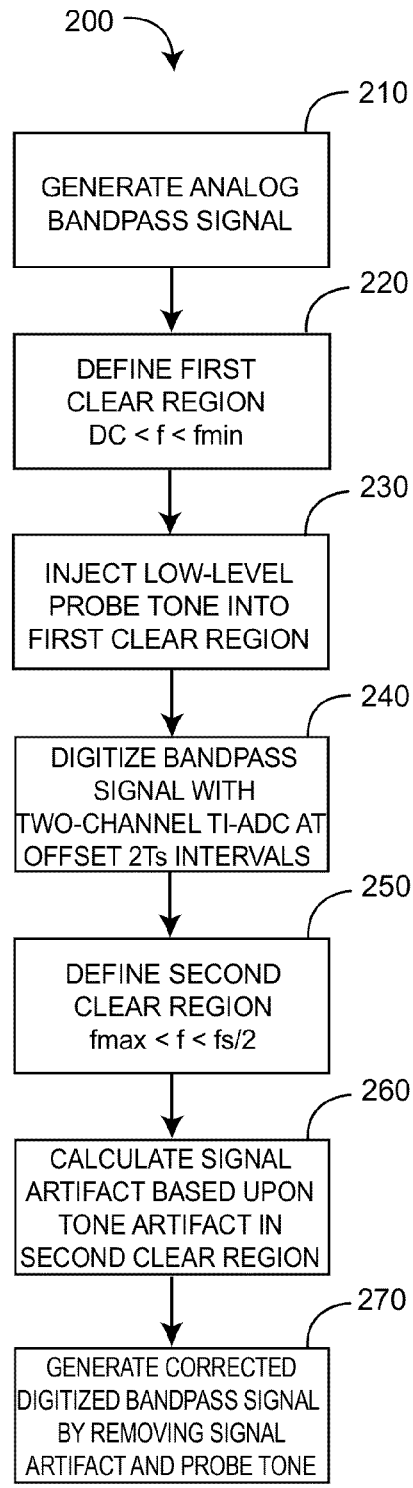
FIG. 2 is a flow diagram of a TI-ADC method.

FIG. 2 illustrates an exemplar tone-injected, TI-ADC digitization method 200. Initially, an analog bandpass signal is generated 210. See FIG. 3A. Accordingly, a first clear region is defined 220 between DC and $f_{min}$. A low-level probe tone is injected into the first clear region 230. See FIG. 3B. The bandpass signal is digitized with a 2-channel TI-ADC 240. This results in a second clear region defined between fmax and fs/2 250. See FIG. 3C. Signal artifact is calculated based upon the tone artifact appearing in the second clear region 260. See FIG. 3D. An artifact corrected, digitized signal is generated by removing the signal artifact and the probe tone 270.

Figure 3A:
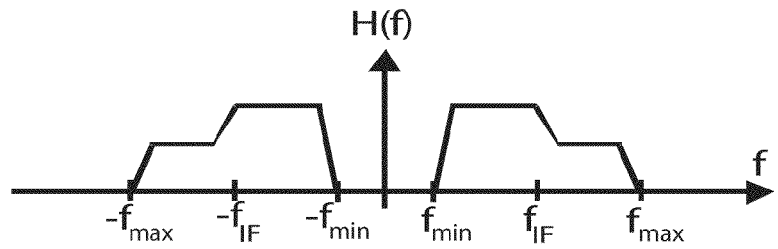
FIGS. 3A-D are exemplar tone-injected, TI-ADC digitized signal spectrums.
Figure 3B:
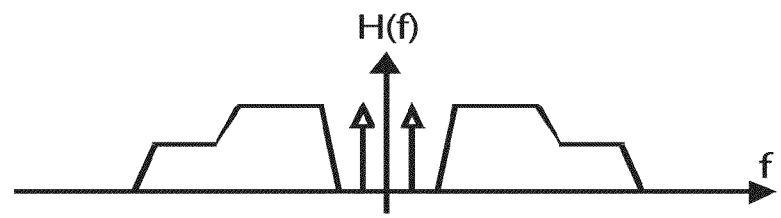
Figure 3C:
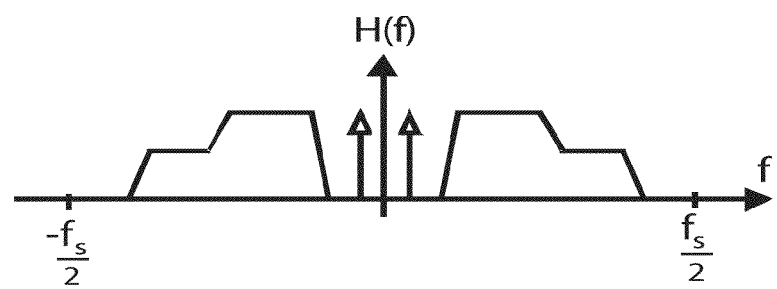
Figure 3D:
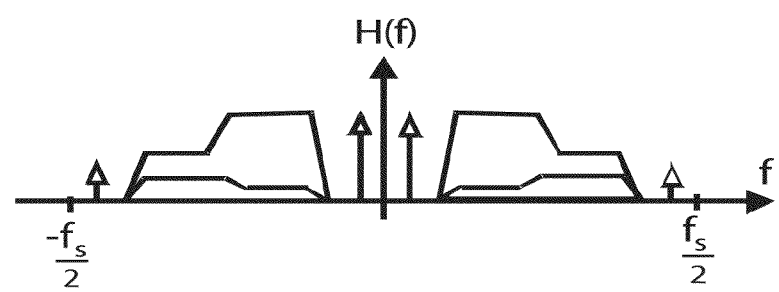

FIGS. 3A-D illustrate a theoretical example of a band-pass signal is shown in FIG. 3A. In a common digital receiver, with only one analog to digital converter, the sampling frequency $f_{ST}$ is selected in order to satisfy the equality $f_{ST}=2\times f_{MAX}+\Delta f$ where $\Delta f$ is called oversampling factor. Note that it represents the gap between the two signal spectra replicas after sampling. It is of interest to choose this factor as small as possible, compatible with the requirements for the subsequent filtering tasks that the digital receiver has to handle. In a practical receiver usually $$0<\Delta f\leq 2f_{IF}-BW \quad (1)$$

In the most common case of equality $$\frac{f_{IF}}{f_{ST}}=\frac{1}{4}.$$

Note that the case $\epsilon>2f_{IF}-BW$ corresponds to a gap between $f_{MAX}$ and $$\frac{f_{ST}}{2}$$

that is bigger than the gap between the zero frequency and $f_{MIN}$ in the first Nyquist zone. This hypothesis is commonly discarded because it implies wastage of bandwidth. When a two channel TI-ADC is used, the same sampling frequency $$f_{S_{0,1}}=\frac{f_{ST}}{2}$$

is used on each arm with a time shift of the initial sampling time in one of the arms equal to $$\frac{1}{f_{ST}}.$$

Figure 4:
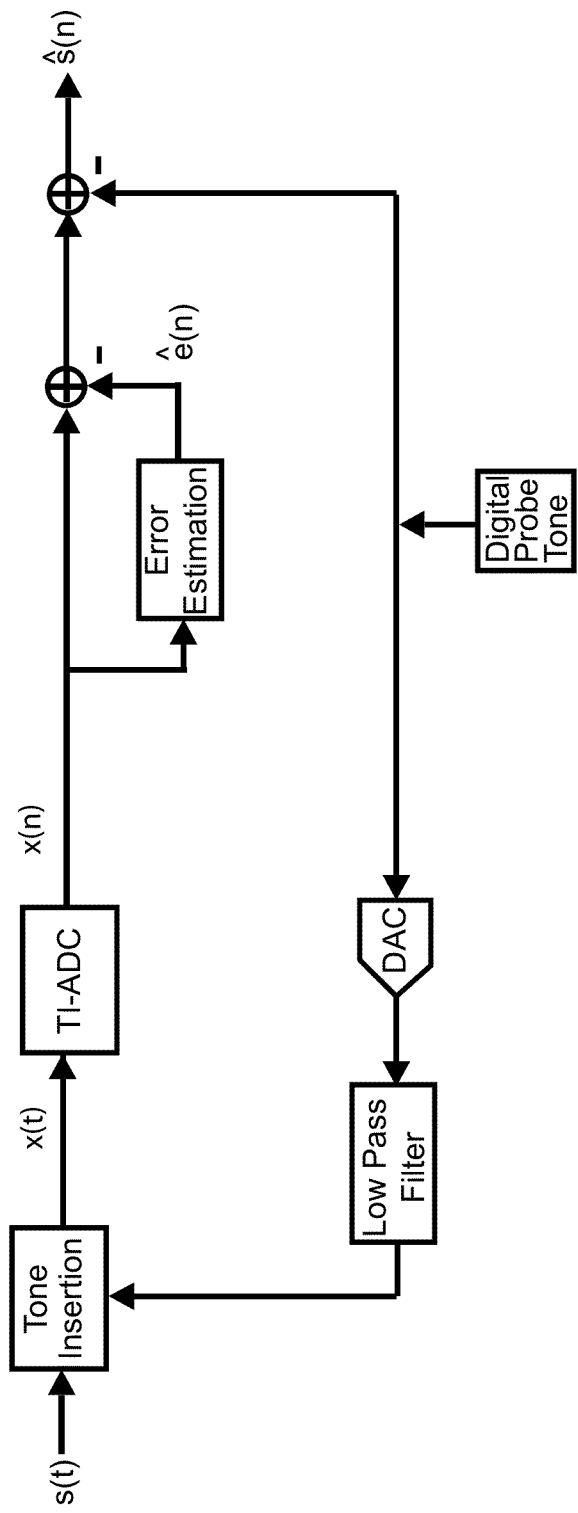
FIG. 4 is a block diagram of TI-ADC artifact compensation embodiment.
Figure 5:
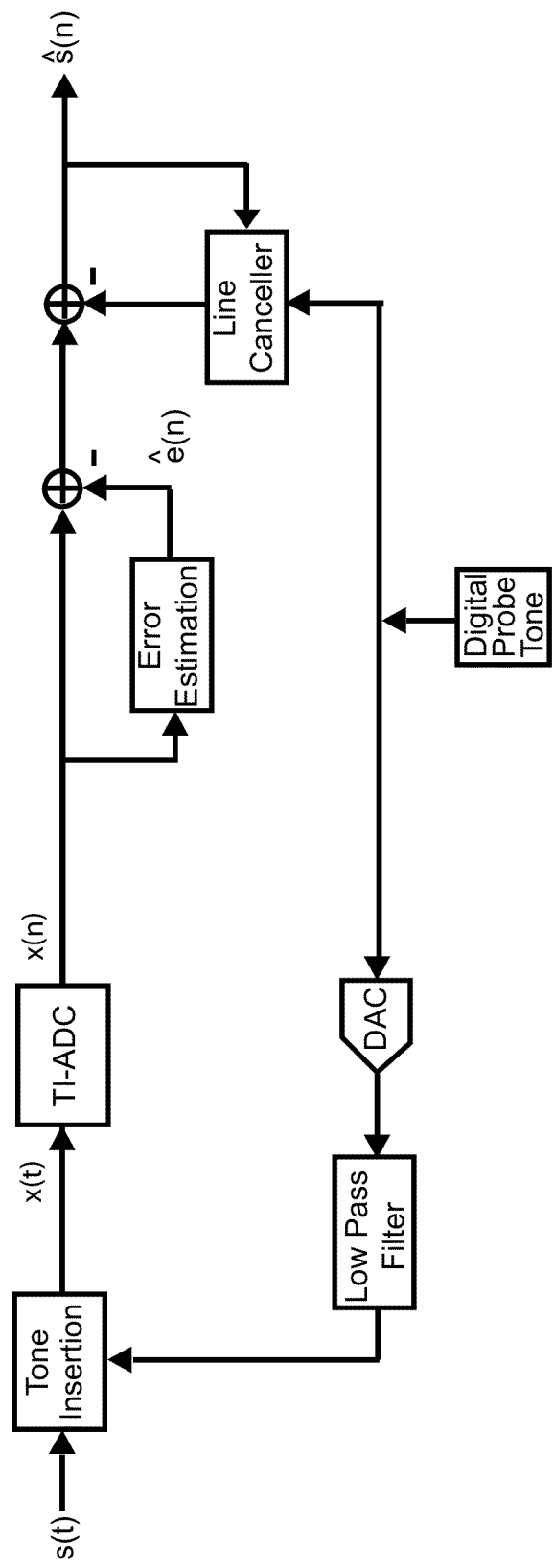
FIG. 5 is a block diagram of another TI-ADC artifact compensation embodiment.
Figure 6:
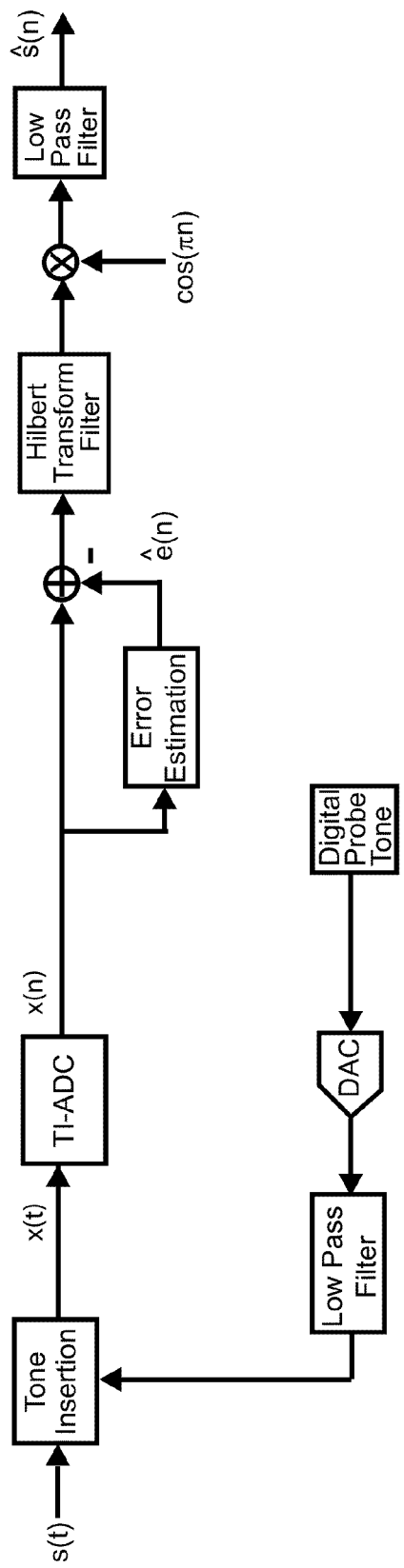
FIG. 6 is a block diagram of another TI-ADC artifact compensation embodiment.

These sampling frequencies violate Nyquist sampling theorem and, as a consequence of that, the negative side of the replica that resides in the second Nyquist zone appears in the first Nyquist zone. This replica should be automatically suppressed at the output of the multiplexer if no mismatches are present in the structure. Note that $$\frac{\Delta f}{2}$$

represents the gap between $f_{MAX}$, the maximum frequency of the input signal, and $f_{S_{0,1}}$. It also represents the gap between the zero frequency and the minimum frequency of the negative replica coming from the second Nyquist zone. In the case in which $$\frac{\Delta f}{2}=f_{IF}-\frac{BW}{2}$$

the two replicas, the positive one belonging to the first Nyquist zone and the negative one belonging to the second Nyquist zone, will perfectly overlap on each other and it is difficult to visualize the mismatches caused by the time and gain offset. In the case in which $$\frac{\epsilon}{2}<f_{IF}-\frac{BW}{2}$$

the negative side of the signal replicas belonging to the second Nyquist zone will partially overlap on the positive signal part belonging to the first Nyquist zone; it will be, in fact, closer to zero. It is clear that, for both of the cases specified above, there is no undesired energy between $f_{MAX}$ and $f_{S_{0,1}}$. This is exactly the spectral region in which mismatching bandwidths have been defined and for which high-pass filters have been designed FIGS. 4-6 illustrate advantageous balancing structures for correcting mismatches occurring in a two channel TI-ADC. These balancing structures are capable of operating on band-pass signals and correcting time mismatches in a two channel TI-ADC and time and gain mismatches in an M-channel TI-ADC. These structures are derived by modeling the time and gain offsets of the ADCs and by identifying, at the output of TI-ADC, the different contributions of the signal and of the error caused by the mismatches. The error estimate is based on the assumptions that the timing offsets are small relative to the overall sampling period, $T_{ST}$, and their average value is zero. The basic observation that underlies both of these structures is that by oversampling the input signal s(t) with a TI-ADC in which no mismatches occur, some spectral regions can be observed where no signal energy is present. However, because of gain and time offsets between the two channels, a certain amount of undesired energy appears in these bands (called mismatching bandwidths). By filtering and minimizing this energy it is possible to adaptively identify and correct both of the mismatches, and for this purpose the least-mean-square (LMS) algorithm is an option. Note that the assumption on the band-pass nature of the input signal, along with the knowledge of the sampling frequency, allows prediction of the position of the mismatching bandwidths and design of high-pass filters to isolate, monitor, and correctly process these spectral regions.

Figure 7:
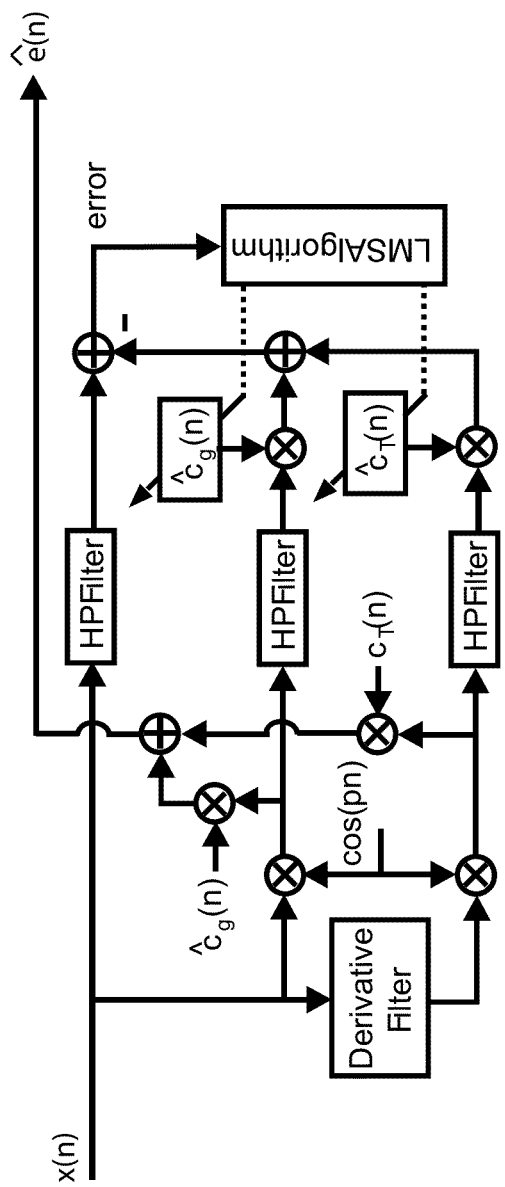
FIG. 7 is a block diagram of an error estimator embodiment for a TI-ADC artifact compensation system.

FIG. 7 illustrates an error estimator embodiment for a TI-ADC artifact compensation system. In order to present a certain amount of energy to the high-pass filters for allowing the estimation of the multiplier coefficients $\hat{c}_g(n)$ and $\hat{c}_T(n)$ that are adapted to minimize this energy in the mean-square sense, a probe signal $\sin(2\pi f_c t)$ is inserted in a proper position, between DC and $f_{MIN}$, in the analog spectrum of the TI-ADC input signal. Note that $f_c$ should not to be too close to DC, because that will cause an undesired increase in the convergence time of the LMS algorithm, on the other side, on each arm, after sampling it is desired that $f_c$ is as far as possible from the information signal, so that a smaller number of taps are used in the design of the high-pass filters for the identification task. From the previous derivations, it is clear that $$f_c \in \left]0, \frac{\Delta f}{2}\right]$$

and as a consequence of the above cited reasons $$fc=\frac{\Delta f}{4}.$$

Note that, as consequence of the spectral folding caused by Nyquist sampling theorem violation occurring in each arm, the sine wave falls exactly in the pass-band of the high-pass filters.

Once the error estimation and correction is done, a balancing structure embodiment only has to cancel the probe signal from the now balanced interleaved ADC. As shown in FIG. 4, in an embodiment, the probe tone is simply subtracted from the balanced output.

As shown in FIG. 5, in an embodiment the probe tone is cancelled with a standard line canceller. A digital version of the probe signal originally generated for insertion in the analog signal path is now used by the line cancelling filter to be phase aligned and scaled and then subtracted from the balanced sampled data digital sequence. The canceller is similar in structure to the DC canceller that removes the DC offset components from the individual interleaved ADCs.

As shown in FIG. 6, it is processed by a Hilbert transform. Once the error estimation and correction is done, the receiver down converts the input signal to base-band and filters it in order to remove the residual sine wave that was previously inserted. By knowing its exact position this is not a difficult task. Before shifting the signal to DC, it is processed by a Hilbert transform filter, which is an inexpensive and easy solution that has the double effect of canceling the negative part of the input signal and down sampling it 2:1. If the overall sampling frequency is selected to satisfy the equality in Equation (1), after being processed by the Hilbert transform, the complex signal spectrum resides around 0.5 in the normalized frequency domain with its sampling frequency being halved. At this point, a digital down sampler, that is actually a sequence of $(-1)^n$ multiplied with the signal, shifts it to base-band where it can easily be low-pass filtered for removing the probe inserted in the analog domain. Note that along with the probing tone, as consequence of this last filtering process, also the DC offset is eliminated.

Figure 8A:
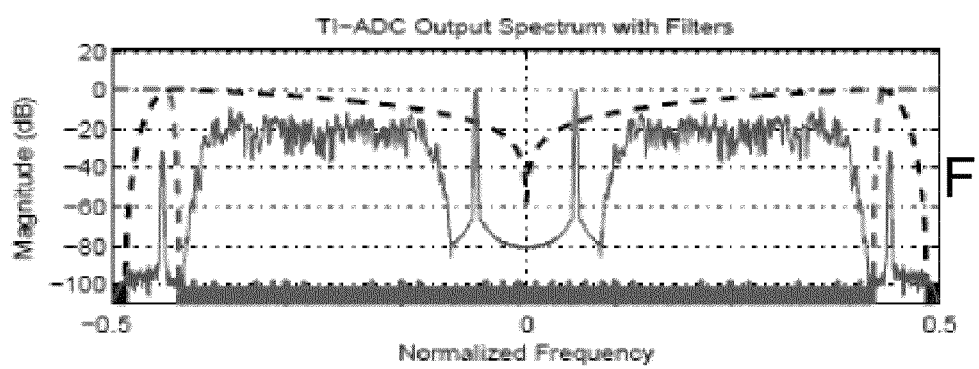
FIGS. 8A-B are a typical intermediate frequency spectrum at the output of TI-ADC affected by gain and time mismatches with superimposed derivative and high-pass filters, and a spectrum at the output of the identification and correction structure, respectively.
Figure 8B:
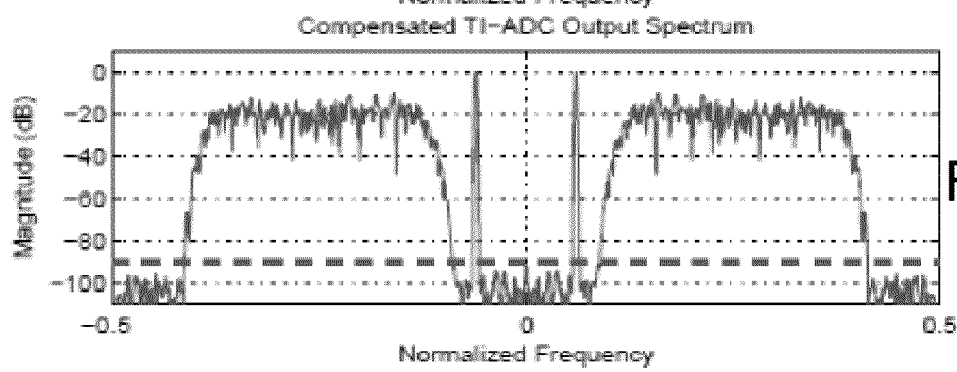

FIGS. 8A-B illustrate simulations that show the effectiveness of this advantageous structure. In FIG. 8A, the spectrum of a QPSK signal processed by a two-channel TI-ADC with gain and time offsets is shown. The sine tone injected in the analog domain at the normalized frequency $f_c=0.06$ is also shown. The timing offsets for this example are $r_0=0$ and $r_1=0.04$ which corresponds to a 4% error on the overall sampling time. Note that the first time delay is used as a reference point in the simulations. The gain offsets are $g_0=0$ and $g_1=0.05$ which corresponds to a 5% error on the second arm of the TI-ADC. The spectra of the derivative and the high-pass filters designed for the errors estimation structure are superimposed in this plot. As Nyquist sampling criterion is violated, a spectral copy of the training or probe tone appears at the normalized frequency of 0.44 that is exactly located in the mismatching bandwidth filtered by the high-pass filters. Note that the QPSK signal replica that should belong to the second Nyquist zone also appears in the first one. This replica is completely superimposed on the signal and, for this reason, it is not possible to demonstrate its presence.

In FIG. 8B, the signal spectrum at the output of the compensator is shown. The training tone due to mismatches is now absent: by using the proposed estimation and compensation structure, its energy is reduced below 90 dB. This value is indicated by the dotted line in the figure.

Figure 9A:
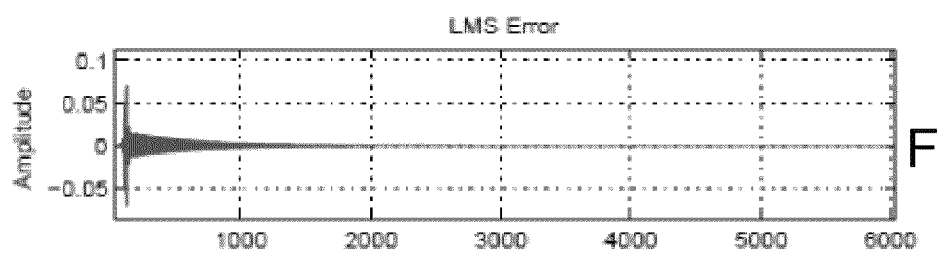
FIGS. 9A-C are graphs of convergence behavior and estimated LMS error, estimated gain error and estimated timing error, respectively.
Figure 9B:
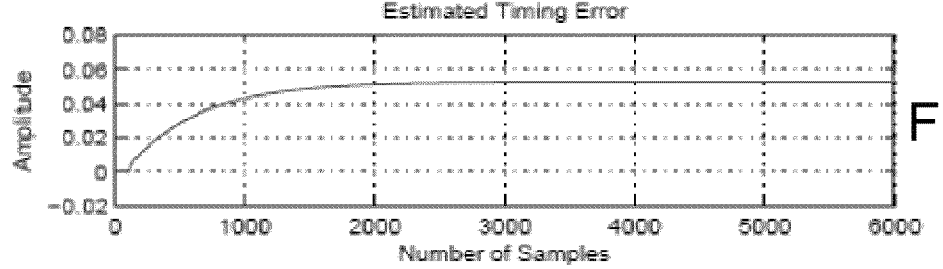
Figure 9C:
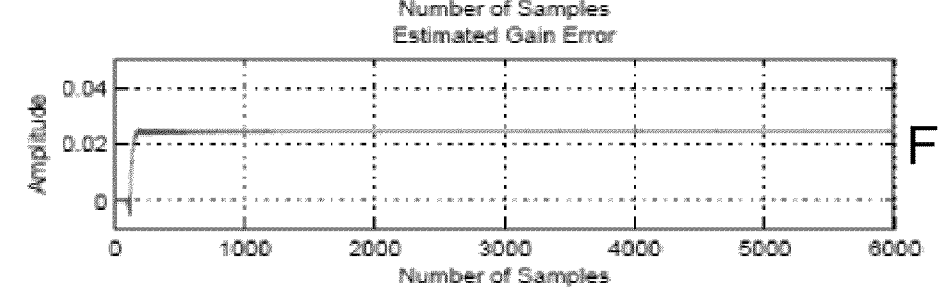

FIGS. 9A-C show the convergence behavior of the estimation process. The LMS error converges when the timing and gain errors converge to their correct values. The chosen step for the LMS algorithm in this example is $\mu=0.04$. Because the LMS algorithm has been applied to minimizing the energy of a deterministic sine tone, the converged value of the error has zero mean with zero variance. In FIG. 4B, the convergence behavior of the weight associated with the timing error is shown. It converges to the proper value after 4000 samples. Similarly, FIG. 4C shows the convergence process of the weight associated with the gain error estimation; the process converges after 200 samples to 0.025 which is the theoretical expected value corresponding to the average value of the ADCs gains.

Figure 10A:
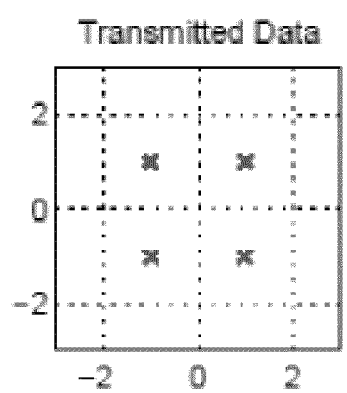
FIGS. 10A-C are plots of transmitted QPSK constellation, effect of gain and timing mismatches on the transmitted QPSK constellation and effect of the correction structure on the output QPSK constellation of the TI-ADC, respectively.
Figure 10B:
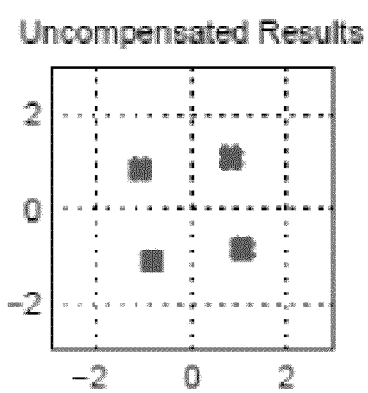
Figure 10C:
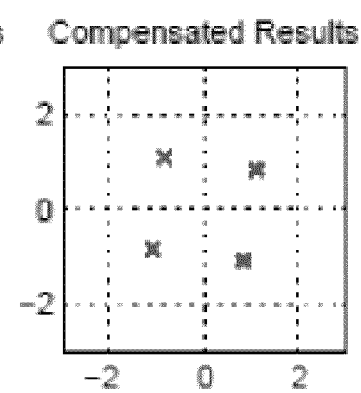

FIGS. 10A-C show the comparison of the demodulated QPSK constellation after correction and the transmitted one, in order to demonstrate the degree of mismatch suppression which cannot be seen directly in the spectral plots. The demodulation is achieved by a standard down conversion process such as a digital down converter and pair of low-pass filters or by a Hilbert Transform filter and digital down converter. A Hilbert transform gives access to the analytic signal and its complex envelope. Further filtering is performed to suppress the probe tone. Finally, the matched filter, with the proper time alignment, but not phase correction, is applied to the complex base-band signal to maximize its signal to noise ratio. The constellation resulting from this process is shown in FIG. 5C along with the transmitted QPSK constellation in FIG. 10A and the corrupted QPSK constellation at the output of TI-ADC in FIG. 10B. It is clearly shown that the TI-ADC mismatches result in an increased variance cloud around the matched filter output constellation points. The variance clouds are completely removed by using the proposed structure. This suppression technique can be applied to a different alias distorted signal to better illustrate its performance. Note that it may be a jump in faith to assume that suppressing the probe tone located in the out-of-band spectral region leads to similar suppression levels of spectral artifacts in the in-band spectral region.

Figures 11A, 11B:
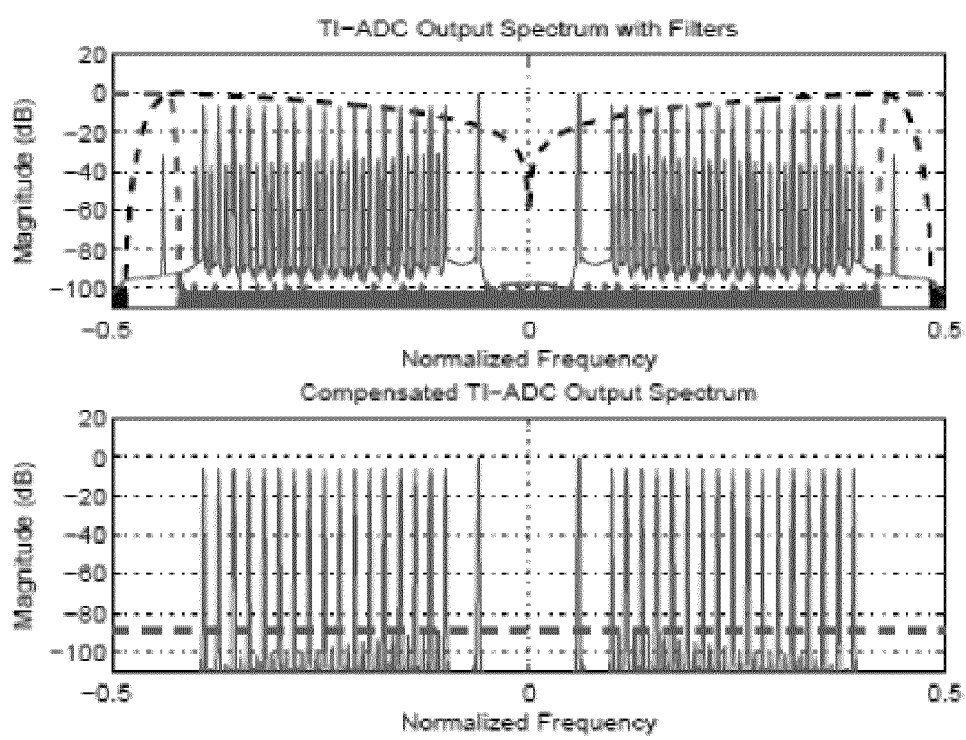
FIGS. 11A-B are spectra formed by a comb of sine waves along with the probe sine wave at the output of TI-ADC affected by gain and time mismatches with superimposed derivative and high-pass filters, and the comb of sine waves at the output of the identification and correction structure, respectively; the gaps in the spectral comb offer a view of the spectral terms generated by the imbalance process.

FIGS. 11A-B show the results of the second example that completely demonstrates the effectiveness of this structure. In this example, 17 equally spaced sine waves are generated spanning frequencies from 0.1 to 0.4 on the normalized frequency axis. The training tone is still located at fc=0.06 and the gain and time errors are the same as those used in the simulation of FIGS. 8A-B. The combined effects of time and gain offsets can be visualized in FIG. 11A where the folded spectrum, coming from the second Nyquist zone and unsuppressed at the output of the multiplexer, appear between the spectral line of the constructed information signal. FIG. 11B shows the spectrum obtained after compensation. One can clearly recognize that the spectral artifacts are significantly reduced while the training tone is completely suppressed. It is noted that a residual spectrum containing the artifact remnants that were not suppressed to the same degree as the probe signal. It is below −90 dB that is underlined by means of the dotted red line in the same picture. Note that before compensation, the maximum amplitude, on log scale, of the spurious peaks affecting the signal is −30.2 dB; after compensation their maximum amplitude is −90 dB. This result clearly demonstrates that this structure is capable of obtaining improvement of approximately 60 dB. It is interesting to look at the residual mismatching spectrum inside the signal information bandwidth; it has a frequency dependent amplitude with a slope reminiscent of a frequency shifted derivative filter believed to be an uncompensated residual timing error likely attributed to higher order Taylor Series terms in the error approximation. This observation suggests a direction of improving the structure for complete suppression of the residual mismatch spectrum within the signal spectrum, namely use of a second derivative filter and estimation of the required second timing coefficient value.

Figure 12A:
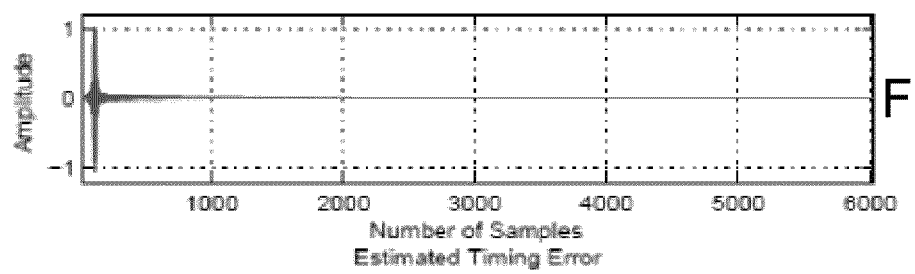
FIGS. 12A-C are plots of convergence behavior and estimated LMS error for the sine wave spectrum, estimated gain error, and estimated timing error, respectively.
Figure 12B:
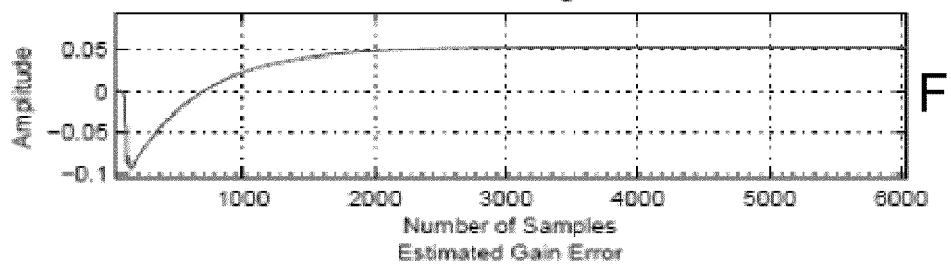
Figure 12C:
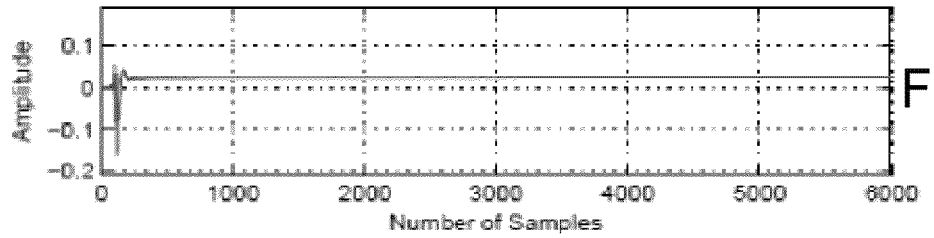

For completeness, FIGS. 12A-C show the LMS convergence behavior, along with the time and gain offsets estimation for the sine waves spectrum case. The $\mu$ value is the same used in the simulation of FIGS. 9A-C.

An easy solution is provided for applying existing two-channel TI-ADC schemes to a realistic communication scenario. The semi-blind solution is useful for estimating and compensating both timing and gain mismatches in the digital data domain. The compensation scheme is followed, in the digital data section of the receiver, by, for example, a Hilbert transform filter followed by a digital down converter and by a low pass-filter for obtaining the transmitted base-band signal. Simulation results show that, by using this structure, the undesired spectral folding, caused by the TI-ADC mismatches, is advantageously decreased by approximately 60 dB.

An artifact-corrected time-interleaved analog-to-digital converter for communication signals has been disclosed in detail in connection with various embodiments. These embodiments are disclosed by way of examples only and are not to limit the scope of this disclosure. One of ordinary skill in art will appreciate many variations and modifications.

What is claimed is:

1. An artifact-corrected time-interleaved analog-to-digital converter (TI-ADC) comprising:
   a bandpass signal s(t) input;
   s(t) having a spectrum with a first clear region proximate DC and a second clear region proximate fmax, where fmax is the upper frequency limit of the spectrum;
   a tone inserter that injects a probe tone into signal s(t) proximate DC so as to generate a tone injected signal x(t);
   a TI-ADC that digitizes x(t) to generate a digitized tone injected signal x(n);
   an error estimator that calculates a signal artifact estimate ê(n) based upon x(n) proximate fmax; and
   at least one subtractor that removes ê(n) and the probe tone from x(n) so as to generate an artifact-corrected signal output ŝ(n).

2. The artifact-corrected TI-ADC according to claim 1 wherein the error estimator comprises:
   a high pass filter that inputs x(n) and outputs a signal plus tone artifact;
   a first differencer that generates an error responsive to the signal plus tone artifact; and
   a LMS algorithm that mean-square minimizes the tone artifact energy so as to generate ê(n).

3. The artifact-corrected TI-ADC according to claim 2 wherein the error estimator further comprises:
   a timing error coefficient and a gain error coefficient responsive to the LMS algorithm; and
   the error responsive to the timing and gain error coefficients and the probe tone.

4. The artifact-corrected TI-ADC according to claim 3 further comprising:
   a first subtractor that removes ê(n) from x(n) to generate an artifact corrected signal; and
   a second subtractor that removes the probe tone from the artifact corrected signal.

5. The artifact-corrected TI-ADC according to claim 3 further comprising:
   a first subtractor that removes ê(n) from x(n) to generate an artifact corrected signal; and
   a line canceller that removes the probe tone from the artifact corrected signal.

6. The artifact-corrected TI-ADC according to claim 3 further comprising:
   a first subtractor that removes ê(n) from x(n) to generate an artifact corrected signal;
   a Hilbert transform that cancels the negative part of the artifact corrected signal and down samples 2:1;
   a digital down sampler that shifts the Hilbert transform output to baseband; and
   a low pass filter that removes the probe tone.

7. An artifact-corrected time-interleaved analog-to-digital conversion (TI-ADC) method comprising:
   generating an analog band-pass signal having frequencies f, such that f is greater than a positive value fmin and less than a positive value fmax;
   defining a first clear region of the signal between DC and fmin;
   injecting a probe tone into the first clear region;
   digitizing the signal with a time-interleaved analog-to-digital converter (TI-ADC);
   defining a second clear region of the signal greater than fmax;
   calculating a signal artifact based upon a tone artifact in the second clear region due to the probe tone;
   removing the signal artifact; and
   removing the probe tone.

8. The artifact-corrected TI-ADC method according to claim 7 wherein calculating a signal artifact comprises:
   high-pass filtering the digitized signal to isolate the signal artifact and the tone artifact; and
   generating an error responsive to the signal artifact and the tone artifact.

9. The time-interleaved analog-to-digital conversion method according to claim 8 wherein calculating a signal artifact further comprises:
   calculating a gain coefficient and a timing coefficient responsive to the probe tone;
   adjusting the gain coefficient and the timing coefficient so as to LMS minimize the tone artifact; and
   generating a signal artifact error responsive to the gain coefficient and the timing coefficient.

10. The time-interleaved analog-to-digital conversion method according to claim 9 wherein removing the signal artifact comprises subtracting the signal artifact error from the digitized signal to generate an artifact corrected signal.

11. The time-interleaved analog-to-digital conversion method according to claim 10 wherein removing the probe tone comprises subtracting the probe tone from the artifact corrected signal.

12. An artifact-corrected time-interleaved analog-to-digital converter (TI-ADC) comprising:
   a bandpass signal s(t) input;
   s(t) having a spectrum with a first clear region proximate DC and a second clear region proximate fmax, where fmax is the upper frequency limit of the spectrum;
   a tone inserter that injects a probe tone into signal s(t) proximate DC so as to generate a tone injected signal x(t);
   a TI-ADC that digitizes x(t) to generate a digitized tone injected signal x(n);
   an error estimator means that calculates an estimated signal artifact based upon the probe tone;
   a subtractor that removes the estimated signal artifact from x(n) to generate an artifact-corrected x(n); and
   a probe tone deletion means for removing the probe tone from the artifact-corrected x(n).

13. The artifact-corrected time-interleaved analog-to-digital converter (TI-ADC) according to claim 12 wherein the error estimator means comprises a gain and timing coefficient means of estimating the probe tone artifact.

* * * * *